(12) United States Patent
Tegen (10) Patent No.: US 9,269,711 B2
(45) Date of Patent: Feb. 23, 2016

(54) SEMICONDUCTOR DEVICE

(71) Applicant: Infineon Technologies Austria AG, Villach (AT)

(72) Inventor: Stefan Tegen, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 108 days.

(21) Appl. No.: 13/932,564

(22) Filed: Jul. 1, 2013

(65) Prior Publication Data

US 2015/0001629 A1   Jan. 1, 2015

(51) Int. Cl.
| | | |
|---|---|---|
| H01L 27/088 | (2006.01) | |
| H01L 29/66 | (2006.01) | |
| H01L 29/06 | (2006.01) | |
| H01L 27/06 | (2006.01) | |

(52) U.S. Cl.
CPC ........ *H01L 27/0886* (2013.01); *H01L 29/0657* (2013.01); *H01L 29/66795* (2013.01); *H01L 27/0629* (2013.01)

(58) Field of Classification Search
CPC .............. H01L 29/0653; H01L 29/407; H01L 29/7813; H01L 29/7835; H01L 29/0847; H01L 27/088
USPC ........................................................ 257/368
See application file for complete search history.

(56) References Cited

U.S. PATENT DOCUMENTS

| | | | | |
|---|---|---|---|---|
| 2001/0040273 | A1* | 11/2001 | Hueting | .......... H01L 21/823418 |
| | | | | 257/623 |
| 2004/0061103 | A1* | 4/2004 | Kendall | .................... B82B 1/00 |
| | | | | 257/30 |
| 2007/0085153 | A1* | 4/2007 | Kalpat et al. | .................. 257/401 |
| 2008/0061320 | A1* | 3/2008 | von Kluge | ........ H01L 27/10876 |
| | | | | 257/204 |
| 2009/0001447 | A1* | 1/2009 | Shimizu | ........................ 257/316 |
| 2012/0175634 | A1 | 7/2012 | Weis | |
| 2012/0175635 | A1 | 7/2012 | Weis et al. | |

OTHER PUBLICATIONS

Schloesser, et al. "Semiconductor Device and Method for Manufacturing a Semiconductor Device." U.S. Appl. No. 13/566,742, filed Aug. 3, 2012.

* cited by examiner

*Primary Examiner* — Marc Armand
*Assistant Examiner* — Quinton Brasfield
(74) *Attorney, Agent, or Firm* — Murphy, Bilak & Homiller, PLLC (57) ABSTRACT

A semiconductor device includes a first ridge and a second ridge extending from a first main surface of a semiconductor substrate. The first and second ridges run in a first direction. The semiconductor device further includes a body region disposed in a portion of the semiconductor substrate between the first ridge and the second ridge, and a gate electrode adjacent to the body region. The first and second ridges are connected with the body region. A plurality of further ridges are formed in the body region, the further ridges extending in a second direction intersecting the first direction. The gate electrode runs in the first direction, and the gate electrode is disposed at at least two sides of the further ridges.

12 Claims, 5 Drawing Sheets

SEMICONDUCTOR DEVICE

BACKGROUND

Power MOSFETs (Metal Oxide Semiconductor Field Effect Transistor) are examples of high breakdown voltage semiconductor devices which are used for switching power sources, inverter devices or the like. For example, power MOSFETs are considered to switch high voltages at low-ohmic loads so as to have a very small switching and conduction loss. Power MOSFETs having a small on-resistance ($R_{on}$) and a high breakdown voltage when being switched off are desirable. For example, a power MOSFET should withstand a drain to source voltage Vds of some tens to some hundreds of volts when being switched off. As a further example, power MOSFETs conduct a very large current which may be up to some hundred of amperes at a gate-source voltage of about 10 to 20 V at a low voltage drop Vds.

SUMMARY

According to an embodiment, a semiconductor device comprises a first ridge and a second ridge extending from a first main surface of a semiconductor substrate, the first and second ridges running in a first direction, a body region disposed in a portion of the semiconductor substrate between the first ridge and the second ridge, the first and second ridges being connected with the body region, a plurality of further ridges being formed in the body region, the further ridges extending in a second direction intersecting the first direction, and a gate electrode adjacent to the body region, the gate electrode running in the first direction. The gate electrode is disposed at at least two sides of the further ridges.

According to an embodiment, an integrated circuit comprises a first transistor at least partially formed in a semiconductor substrate. The first transistor comprises a first body region and a first gate electrode. The integrated circuit further comprises a plurality of second transistors connected in series to form a series circuit, the series circuit being connected in series with the first transistor. At least one of the second transistors comprises a first ridge and a second ridge extending from a first main surface of the semiconductor substrate, the first and second ridges running in a first direction. A second body region of at least one of the second transistors is disposed in a portion of the semiconductor substrate between the first ridge and the second ridge. The first and second ridges are connected with the body region. A second gate electrode of said one of the second transistors is disposed adjacent to the second body region, the second gate electrode running in the first direction.

According to a further embodiment, an integrated circuit comprises a first transistor at least partially formed in a semiconductor substrate. The first transistor comprises a first body region and a first gate electrode. The integrated circuit further comprises a plurality of second transistors connected in series to form a series circuit, the series circuit being connected in series with the first transistor. The first transistor includes a first ridge and a second ridge extending from a first main surface of the semiconductor substrate, the first and second ridges running in a first direction. The first body region is disposed in a portion of the semiconductor substrate between the first ridge and the second ridge, and the first gate electrode is disposed adjacent to the first body region, the first gate electrode running in the first direction.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be n-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending on whether the first conductivity type means n-type or p-type.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Figure 1:
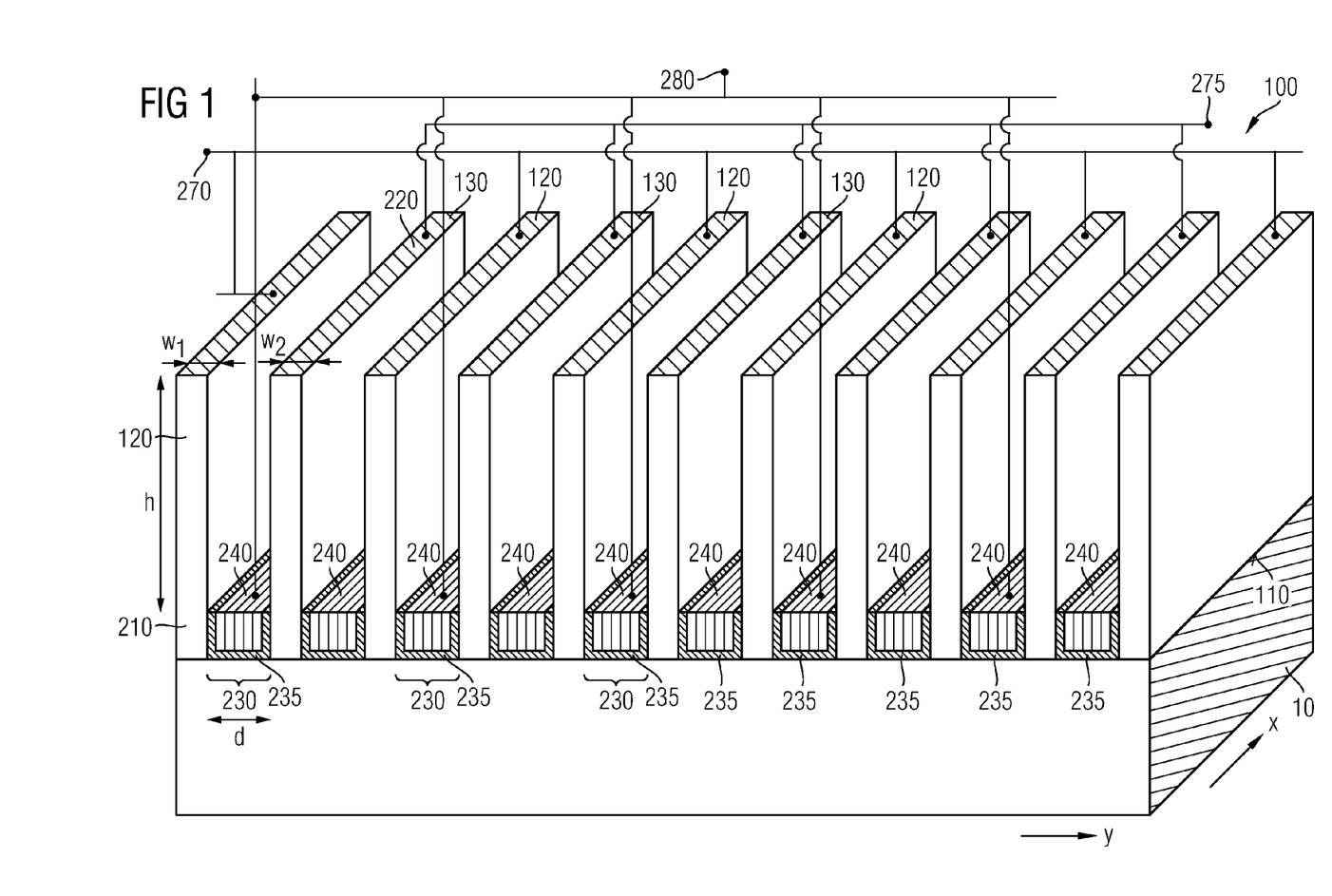
FIG. 1 shows a perspective view of a semiconductor device according to an embodiment.

FIG. 1 illustrates a perspective view of a semiconductor device 100 according to an embodiment. The semiconductor device 100 shown in FIG. 1 comprises a first ridge 120 and a second ridge 130 that extend from a first main surface 110 of a semiconductor substrate 10. The first and second ridges 120, 130 run in a first direction, i.e. the x direction illustrated in FIG. 1. A body region 230 is disposed in a portion of the semiconductor substrate 10 between the first ridge 120 and the second ridge 130. Accordingly, an upper surface of the first and the second ridges 120, 130 is disposed at a greater height than an upper surface of the body region 230. The semiconductor device 100 further comprises a gate electrode 240 that is adjacent to the body region 230. The gate electrode 240 runs in the first direction. For example, the first and second ridges 120, 130 may comprise a semiconductor material and may be doped with dopants of a first conductivity type. A source region 210 is disposed in the first ridge 120, and a drain region 220 is disposed in the second ridge 130. Accordingly, the semiconductor device 100 implements a transistor. When an appropriate voltage is applied between a source terminal coupled to the source region 210 and a drain terminal coupled to the drain region 220, and further a suitable voltage is applied to the gate electrode 240, a current flows between the source region 210 and the drain region 220, the current being controlled by the gate electrode 240. A gate dielectric layer 235 which may comprise silicon oxide, silicon nitride or any other suitable dielectric material is disposed between the gate electrode 240 and the body region 230.

According to the embodiment illustrated in FIG. 1, the body region 230 has a flat surface. In other words, the first main surface 110 of the semiconductor substrate 10 may be flat. According to an embodiment, the first ridge 120 may be made of a material that is selected from the group consisting of polycrystalline silicon, monocrystalline silicon and a conductive material. For example, the first ridge 120 may be made of doped polysilicon material or of titanium nitride (TiN).

According to an embodiment, the second ridge 130 may be formed of monocrystalline silicon. For example, the second ridge 130 may be etched in the monocrystalline silicon substrate 10. The material of the first ridge 120 may be doped with a higher doping concentration than the material of the second ridge 130. According to the embodiment shown in FIG. 1, a current flow is accomplished perpendicularly with respect to the gate electrodes 240 that extend in the first direction. Since the source and the drain regions 210, 220 are disposed in ridges, the mechanical stability of the source and drain regions 210, 220 may be increased. Further, due to the increased cross-sectional area of the source and the drain regions 210, 220, the conductivity of the source and drain regions 210, 220 may be increased, resulting in a reduced resistivity.

According to an embodiment, the width $w_1$, $w_2$ of the first and second ridges 120, 130 may be 10 to 200 nm. The width may be measured along the second direction, perpendicularly with respect to the first direction. The width of the first ridge 120 may be different from the width of the second ridge 130. The distance d between the first ridge 120 and the second ridge 130 may be 30 to 300 nm. The distance between the first ridge 120 and the second ridge 130 corresponds to the channel length of the transistor. The height h of the first and second ridges 120, 130, measured perpendicularly with respect to the first main surface 110 may be 200 to 2000 nm. According to an embodiment, the height of the first ridge 120 may be equal to the height of the second ridge 130. According to a further embodiment, the height of the first ridge 120 is different from the height of the second ridge 130. By setting an appropriate height of the second ridge 130, the ability of the power MOSFET to withstand a high drain-source voltage when being switched off, can be adjusted.

As is further illustrated in FIG. 1, the semiconductor device 100 may comprise a plurality of transistors in the manner described above which are connected in parallel. According to this embodiment, a plurality of first ridges 120 is connected with a source potential 270, a plurality of second ridges 130 is connected with a drain potential 275, and a plurality of gate electrodes 240 is connected with a gate potential 280.

According to a further embodiment, as will be further explained below, such a semiconductor device including a plurality of transistors connected in parallel may be a component of a so-called ADZFET. According to this embodiment, several of the transistor arrays or blocks illustrated in FIG. 1 are connected in series. The transistor arrays are insulated from each other by suitable insulation trenches.

Figure 2:
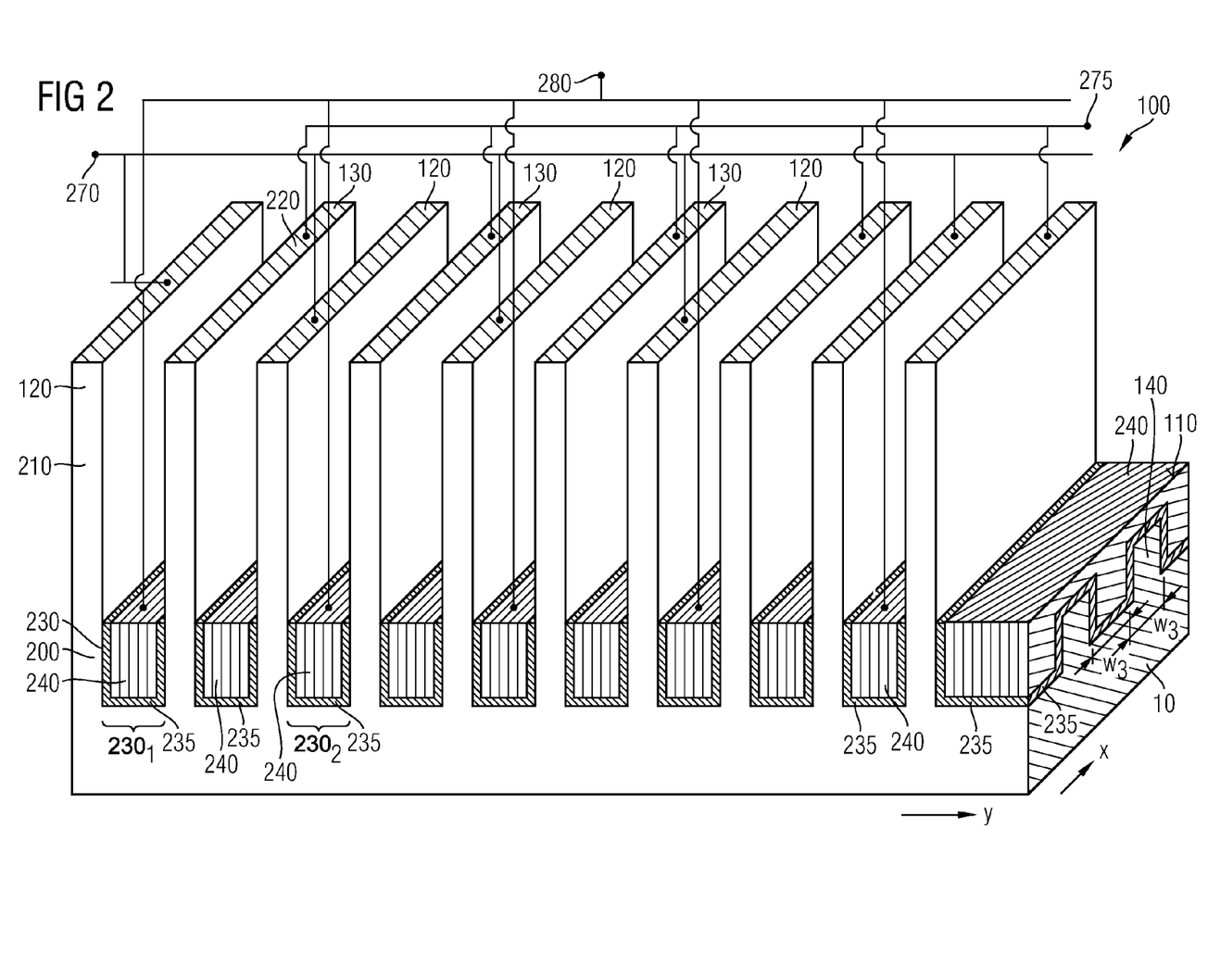
FIG. 2 shows a perspective view of a semiconductor device according to a further embodiment.

FIG. 2 illustrates a perspective view of a semiconductor device 100 according to a further embodiment. FIG. 2 shows the same components as those discussed with respect to FIG. 1. Moreover, in addition to the embodiment of FIG. 1, further ridges 140 are formed in the first main surface 110 of the semiconductor substrate 10 so that the body regions 230 of each of the transistors have the shape of a ridge. The further ridges 140 extend in the second direction, i.e. the y direction. An upper surface of the first and the second ridges 120, 130 is disposed at a greater height than an upper surface of the further ridges 140. According to this embodiment, the gate electrode 240 is disposed at at least two sides of the further ridges 140 in which the body region 230 is disposed.

As is further illustrated in FIG. 2, the semiconductor device 100 may comprise a plurality of transistors in the manner described above which are connected in parallel. According to this embodiment, a plurality of first ridges 120 is connected with a source potential 270, a plurality of second ridges 130 is connected with a drain potential 275, and a plurality of gate electrodes 240 is connected with a gate potential 280.

According to a further embodiment, as will be further explained below, such a semiconductor device including a plurality of transistors connected in parallel may be a component of a so-called ADZFET. According to this embodiment, several of the transistor arrays or blocks illustrated in FIG. 2 are connected in series. The transistor arrays are insulated from each other by suitable insulation trenches.

In comparison with the embodiment illustrated in FIG. 1, the transistor of FIG. 2 has an improved sub-threshold slope of the source-drain current in dependence from the applied gate voltage. Due to the improved sub-threshold slope such a FinFET may be switched at a higher speed. Further, the conductivity of the transistor is improved in comparison with transistors having a planar electrode.

In addition, the source region 210 and the drain region 220 are disposed in ridges 120, 130 extending perpendicularly with respect to the ridges 140 of the body region 230. Accordingly, the width of the source and drain regions 210, 220 may be set independently from the width of the ridge 140. For example, the width of the ridge 140 may be set so that the body region 230 may be fully depleted, and the width of the source and drain regions 210, 220 may be set to reduce their resistance. Hence, these widths may be set independently to optimize the electrical characteristics of the device 100. Further, the width of the source region 210 and the width of the drain region 220 may set independently from each other. Due to the special arrangement, the mechanical stability may be improved. Due to the possibility to choose the width of the fins independently from each other, the design of a transistor cell may be further optimized.

The sizes of the individual components of FIG. 2 may be equal to those of FIG. 1. According to this embodiment, the height h of the first and second ridges 120, 130 is measured from an upper surface of each of the further ridges 140, and has the size as discussed above. Further, the widths of the further ridges 140 $w_3$ may be selected so that the body region 230 of the individual transistors may be fully depleted when a gate voltage is applied.

For example, the width $w_3$ of the further ridges 140, may satisfy the relationship: $w_3 < 2*l_d$, wherein $l_d$ denotes a maximum length of a depletion zone which is formed at the interface between the gate dielectric layer 235 and the body region 230. For example, in a case in which there is a constant doping concentration in the doped regions, the length of the depletion zone may be determined as:

$$l_d = \sqrt{\frac{4\varepsilon_s kT\ln(N_A/n_i)}{q^2 N_A}} \quad (1)$$

wherein $\varepsilon_s$ denotes the permittivity of the semiconductor material (11.9×$\epsilon_0$ for silicon, $\epsilon_0$=8.85×10$^{-14}$ F/cm), k denotes the Boltzmann constant (1.38066×10$^{-23}$ J/k), T denotes the temperature, ln denotes the natural logarithm, $N_A$ denotes the impurity concentration of the semiconductor body, $n_i$ denotes the intrinsic carrier concentration (1.45×10$^{10}$ cm$^{-3}$ for silicon at 27° C.), and q denotes the elementary charge (1.6×10$^{-19}$ C). In case of varying doping concentrations, the above formula may be adapted using corresponding electrostatic calculations.

Generally, the length of the depletion zone varies with the applied gate voltage. Further, it is assumed that in a transistor the length of the depletion zone at a gate voltage corresponding to the threshold voltage corresponds to the maximum length of the depletion zone. For example, the width $w_3$ of the further ridges 140 may be approximately 20 to 120 nm, for example, 50 to 100 nm. According to further embodiments, the width $w_3$ of the further ridges 140 may be much smaller than the double of the maximum length of the depletion zone, for example: $w_3 < 1.5*l_d$ or less.

Although according to the embodiment of FIG. 2, the distances between adjacent ridges 120, 130 is shown to be identical, the distance between ridges may be varied.

Figure 3A:
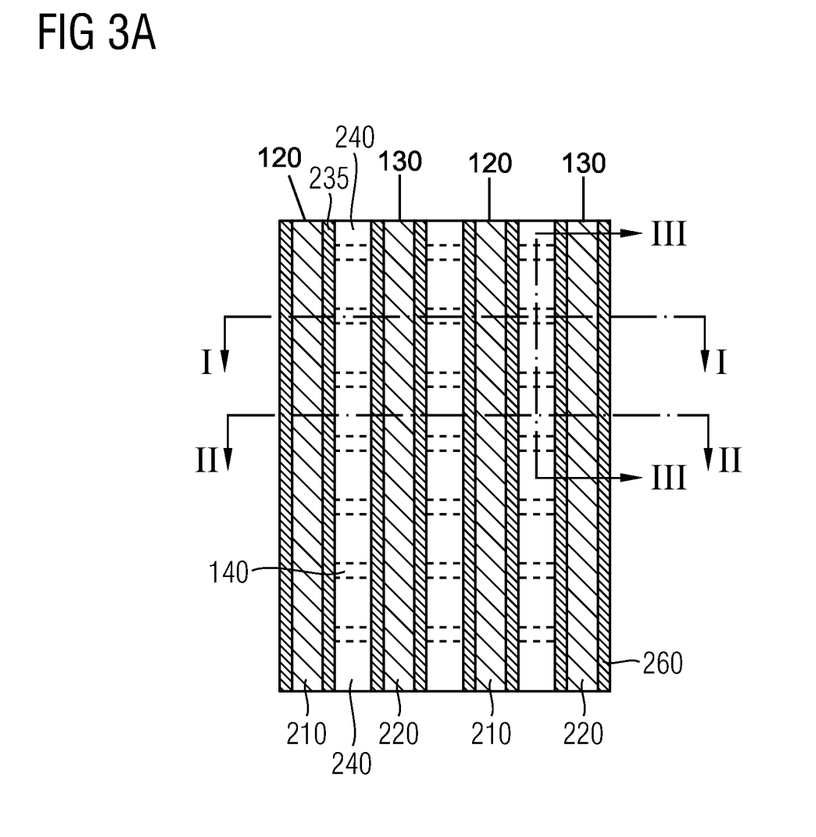
FIGS. 3A to 3D show various views of the semiconductor device illustrated in FIG. 2.

FIGS. 3A to 3D illustrate various views of the semiconductor device. FIG. 3A illustrates a plan view of the semiconductor device. As is shown, first and second ridges 120, 130 are disposed in an alternating manner. The first and second ridges 120, 130 are insulated from the adjacent conductive material of the gate electrodes 240 by means of an insulating material 235 that forms the gate dielectric material. The gate electrodes 240 run parallel to the first and second ridges 120, 130. According to further embodiments, the gate electrode 240 may be omitted from every second trench disposed between a drain region 220 and a source region 210.

Figure 3B:
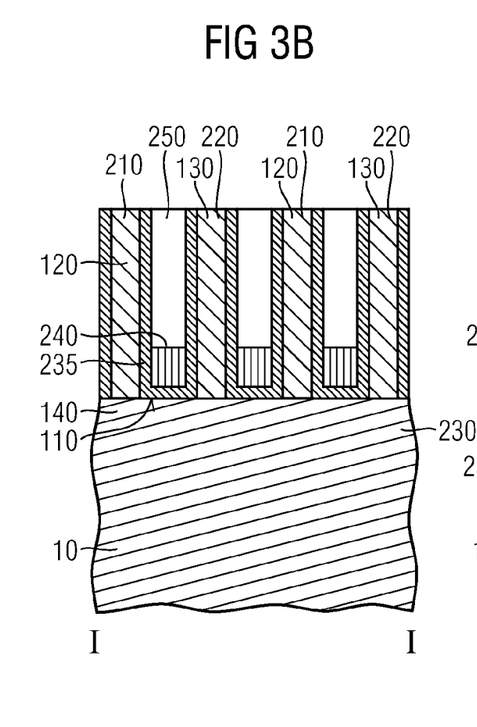

FIG. 3B shows a cross-sectional view of the semiconductor device which is taken between the line labelled I and I illustrated in FIG. 3A. The cross-sectional view of FIG. 3B is taken along a ridge 140 of the body region 230. As is illustrated, the ridges 210, 220 extend from the first main surface 110 of the semiconductor substrate 10. The body region 230 is disposed adjacent to the source region 210 and the drain region 220. The gate electrode 240 is disposed adjacent to the body region 230. The gate electrode 240 is insulated from the body region 230 by a gate dielectric layer 235. The gate dielectric layer 235 may have a thickness of approximately 5 to 60 nm. An insulating material 250 is disposed in the spaces between adjacent ridges 210, 220.

Figure 3C:
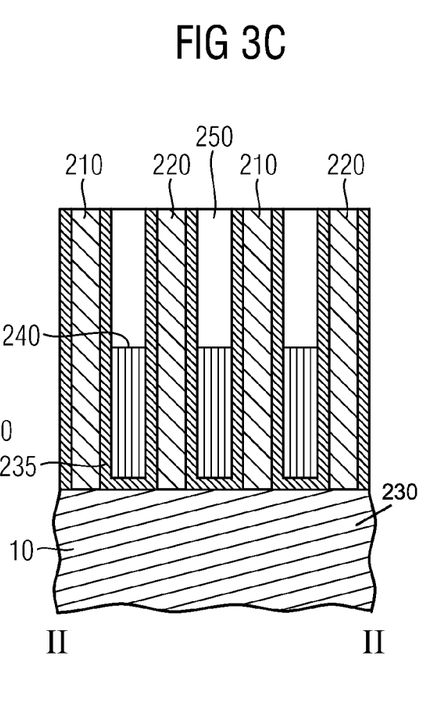

FIG. 3C shows a cross-sectional view of the semiconductor substrate taken along the line labelled II and II illustrated in FIG. 3A. In particular, the cross-sectional view of FIG. 3C is taken between two adjacent ridges 140 in the body region 230. As is shown in FIG. 3C, an upper side of the gate electrode 240 is disposed at approximately the same height as an upper side of the gate electrode 240 illustrated in FIG. 3B. As is further shown in FIG. 3C, the gate electrode 240 extends along a portion of the drain region 220. Accordingly, when the transistor is switched off, a charge compensation within the drain region 220 may take place. In an upper portion of the drain region 220, a charge compensation may take place due to the presence of adjacent source regions 210 which are insulated by means of a relatively thin dielectric layer 250.

Due to the charge compensation, the ability of the transistor to withstand high drain-source voltages when being switched off, can be further increased.

Figure 3D:
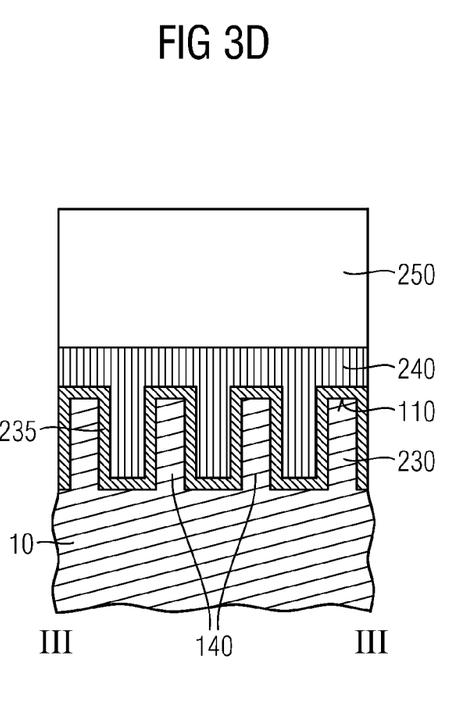

FIG. 3D shows a cross-sectional view of the semiconductor device along a direction perpendicularly with respect to the ridges 140 in the body region 230. The cross-sectional view of FIG. 3D is parallel to any of the first and second ridges 120, 130, and taken along the line labelled III and III illustrated in FIG. 3A. As is illustrated, further ridges 140 are formed so that the transistors form FinFETs. Further, a gate electrode 240 is disposed over the body regions 230. The gate electrode 240 is insulated from the adjacent body region 230 by a gate dielectric layer 235. An insulating material 250 fills the upper portion of the spaces between adjacent ridges 210, 220.

Figure 4A:
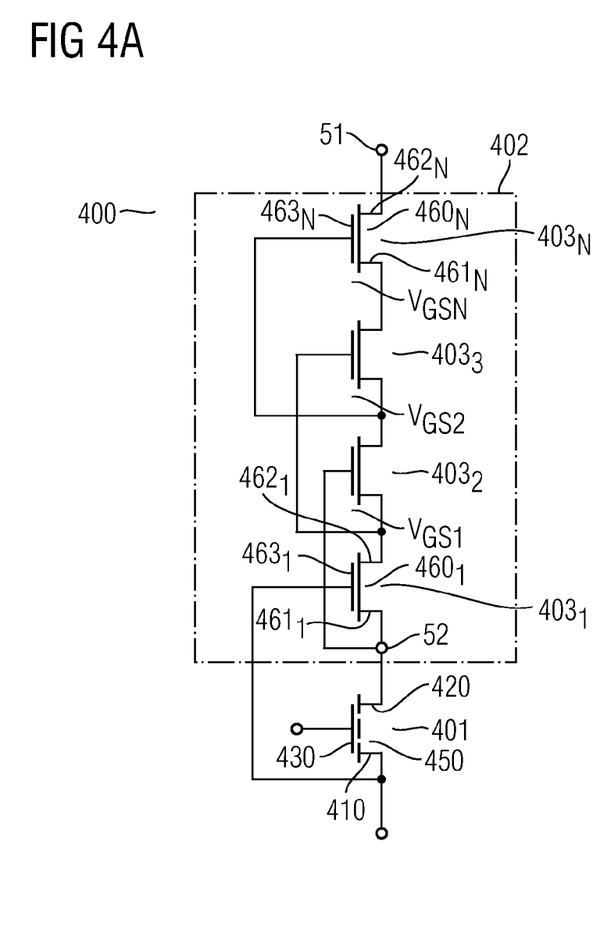
FIGS. 4A and 4B illustrate equivalent circuit diagrams of semiconductor devices according to an embodiment.
Figure 4B:
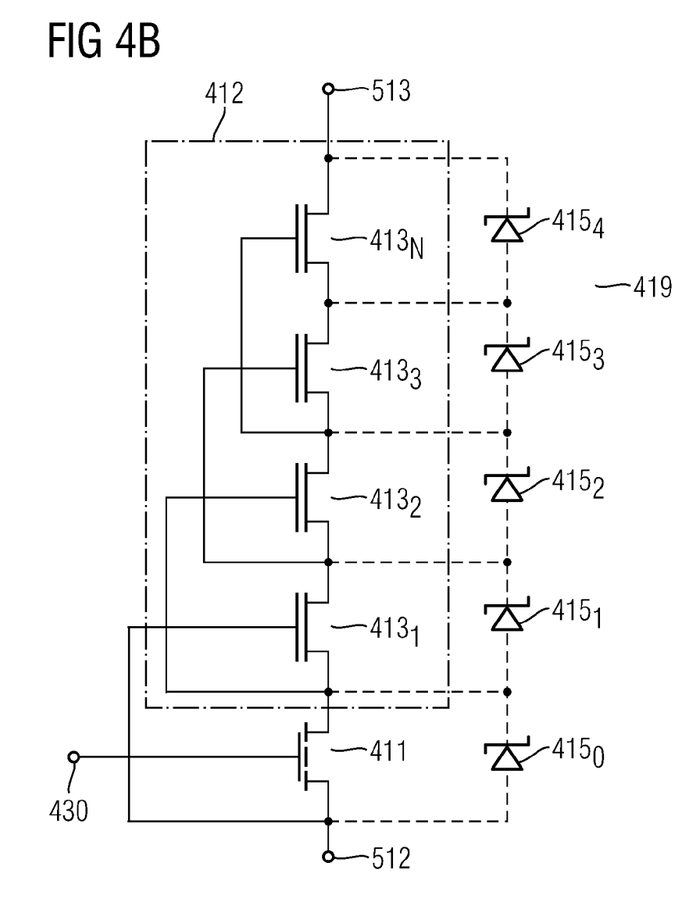

FIGS. 4A and 4B show examples of equivalent circuit diagrams of integrated circuits that may comprise the semiconductor devices according to an embodiment. As is illustrated in FIG. 4A, the integrated circuit 400 comprises a first transistor 401 and a plurality of second transistors $403_1$, $403_2$, ... $403_N$. The first transistor 401 comprises a source region 410, a drain region 420 and a gate electrode 430. For example, the first transistor 401 may be implemented as a so-called enhancement or normally-off field effect transistor. Usually, at a gate voltage Vg=0 V, the first transistor 401 is in an off-state. If a suitable gate voltage, is applied to the gate electrode 430, the first transistor 401 is switched to an on-state, the polarity of the gate voltage depending on whether the FET is a n-channel FET or a p-channel FET. The second transistors $403_1$, ... $403_N$ may be implemented as depletion field effect transistors or normally-on field effect transistors which means that at a gate voltage of 0 V they are in an on-state. Further, by applying a suitable gate voltage, the second transistors are switched off, the polarity of the gate voltage depending on whether it is a p-channel FET or an n-channel FET. The second transistors $403_1$, ... $403_N$ comprise a source region $461_1$, ... $461_N$, a drain region $462_1$, ... $462_N$, and gate electrode $463_1$, ... $463_N$.

The plurality of second transistors $403_1$ to $403_N$ are connected in series with each other and to the first transistor 401. According to an interpretation, the series of second transistors $403_1$ to $403_N$ acts as a drift zone 402 of the first transistor 401. According to this interpretation, terminal 51 acts as a drain terminal of the resulting power semiconductor device 400.

As is further illustrated in FIG. 4A, the output of the first transistor 401 at the terminal 52 is applied to transistor $403_2$ as gate voltage $V_{gs1}$. Moreover, the source voltage of the first transistor 401 is also applied as the gate voltage to the transistor $403_1$. Each of the second transistors $403_1$ ... $403_N$ has its gate electrode $463_1$, ... $463_N$ connected to the drain terminal $462_1$, ... $462_N$ of another one of the second transistors $403_1$, ... $403_N$ or the source 410 or the drain terminal 420 of the first transistor 401. Accordingly, the output of any transistor in the transistor series determines the gate voltage which is applied to a transistor at a later position within the series. Hence, depending on the output at the drain region 420, the overall resistance of the series of the second transistors $403_1$ to $403_N$ can be determined. The semiconductor device thus forms a so-called ADZFET ("active drift zone field effect transistor"). According to an embodiment, any of the first transistor 401 and the series of the second transistors $403_1$ to $403_n$ may be implemented by the transistor described with reference to FIGS. 1 to 3.

According to an embodiment, an integrated circuit 400 comprises a first transistor 401 at least partially formed in a semiconductor substrate 10, the first transistor 401 comprising a first body region 450 and a first gate electrode 430. The integrated circuit 400 further comprises a plurality of second transistors $403_1$, ... $403_N$ connected in series with respect to the further second transistors to form a series circuit, the series circuit being connected in series with the first transistor 401. At least one of the second transistors $403_1$, ... $403_N$ comprises a first ridge 120 and a second ridge 130 extending from a first main surface 110 of the semiconductor substrate 10. The first and the second ridges 120, 130 run in a first direction. A second body region 230, $461_1$, ... $461_N$ of at least one of the second transistors $403_1$, ... $403_N$ is disposed in a portion of the semiconductor substrate between the first ridge 120 and the second ridge 130, the first and the second ridge 120, 130 being connected with the body region 230, and a second gate electrode 240, $463_1$, ... $463_N$ of said one of the second transistors $403_1$, ... $403_N$ is disposed adjacent to the second body region 230, $461_1$, ... $461_N$ and the second gate electrode 240, $463_1$, ... $463_N$ runs in the first direction.

According to another embodiment, the integrated circuit 400 comprises a first transistor 401 that is at least partially formed in a semiconductor substrate 10, the first transistor 401 comprising a first body region 450 and a first gate electrode 430. The integrated circuit further includes a plurality of second transistors $403_1$, ... $403_N$ connected in series with respect to the further second transistors to form a series circuit, the series circuit being connected in series with the first transistor 401. The first transistor 401 comprises a first ridge 120 and a second ridge 130 extending from a first main surface 110 of the semiconductor substrate 10, the first and the second ridges 120, 130 running in a first direction. The first body region 230, 450 is disposed in a portion of the semiconductor substrate 10 between the first ridge 120 and the second ridge 130. The first gate electrode 240, 430 is disposed adjacent to the first body region 230, 450, the first gate electrode 240, 430 running in the first direction.

FIG. 4B shows an equivalent circuit diagram of an integrated circuit 419 according to a further embodiment. The integrated circuit 419 of FIG. 4B additionally comprises a plurality of clamping elements $415_0$ to $415_4$. Each of the clamping elements $415_0$, ... $415_4$ is connected parallel to each of the second transistors $413_4$, ... $413_N$ and the first transistor 411, respectively. For example the clamping elements $415_0$, ... $415_4$ may include Zener diodes or other suitable elements such as tunnel diodes, pin diodes, avalanche diodes or the like. The clamping elements $415_0$, ... $415_4$ provide an over-voltage protection of the single transistors. A detailed description of the clamping elements $415_0$, ... $415_4$ is omitted in the following description. Nevertheless, as is clearly to be understood, the clamping elements $415_0$, ... $415_4$ may be easily accomplished by way of correspondingly implanted semiconductor areas in the peripheries of the illustrated cross-sectional views. In FIG. 4A, the series of second transistors $413_4$, ... $413_N$ implement the drift zone 412.

FIGS. 4A and 4B merely represent equivalent circuit diagrams for interconnecting elements of the integrated circuit. As is to be clearly understood, according to further embodiments different interconnection schemes may be employed. As has been described in the foregoing, at least one of the second transistors may be implemented in the manner illustrated in FIGS. 1 and 2, respectively. Nevertheless, as is to be clearly understood, also the first transistor or only the first transistor 401, 411 may be implemented in the manner as described in FIGS. 1 and 2.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An integrated circuit, comprising:
   a first transistor at least partially formed in a semiconductor substrate, the first transistor comprising a first body region and a first gate electrode;
   a plurality of second transistors connected in series to form a series circuit, the series circuit being connected in series with the first transistor and implementing an active drift zone field effect transistor, at least one of the second transistors comprising:
      a first ridge and a second ridge extending from a first main surface of the semiconductor substrate, the first and second ridges running in a first direction;
      a second body region of at least one of the second transistors being disposed in a portion of the semiconductor substrate between the first ridge and the second ridge, the first and second ridges being connected with the second body region; and
      a second gate electrode of said one of the second transistors being disposed adjacent to the second body region, the second gate electrode running in the first direction.

2. The integrated circuit according to claim 1, wherein a second source region of said one of the second transistors is disposed in the first ridge and a second drain region of said one of the second transistors is disposed in the second ridge.

3. The integrated circuit according to claim 1, wherein the first and second ridges each comprise a semiconductor material and are doped with dopants of a first conductivity type.

4. The integrated circuit according to claim 1, wherein the second body region has a flat surface.

5. The integrated circuit according to claim 1, further comprising a plurality of further ridges in the second body region, the further ridges extending in a second direction intersecting the first direction, the second gate electrode being disposed at at least two sides of the further ridges.

6. The integrated circuit according to claim 1, wherein the first ridge comprises a material selected from the group consisting of polycrystalline silicon, monocrystalline silicon and a conductive material.

7. The integrated circuit according to claim 1, wherein the second ridge comprises monocrystalline silicon.

8. The integrated circuit according to claim 1, wherein a width of the first ridge is different from a width of the second ridge, the widths being measured perpendicularly with respect to the first direction.

9. An integrated circuit, comprising:
   a first transistor at least partially formed in a semiconductor substrate, the first transistor comprising a first body region and a first gate electrode;
   a plurality of second transistors connected in series to form a series circuit, the series circuit being connected in series with the first transistor and implementing an active drift zone field effect transistor, the first transistor comprising:
      a first ridge and a second ridge extending from a first main surface of the semiconductor substrate, the first and second ridges running in a first direction;
      the first body region being disposed in a portion of the semiconductor substrate between the first ridge and the second ridge; and
      the first gate electrode being disposed adjacent to the first body region, the first gate electrode running in the first direction.

10. The integrated circuit according to claim 9, wherein the first and second ridges are doped with dopants of a first conductivity type, a first source region of the first transistor is disposed in the first ridge and a first drain region of the first transistor is disposed in the second ridge.

11. The integrated circuit according to claim 9, wherein the first body region has a flat surface.

12. The integrated circuit according to claim 9, further comprising a plurality of further ridges in the first body region, the further ridges extending in a second direction intersecting the first direction, the first gate electrode being disposed at at least two sides of the further ridges.

* * * * *